United States Patent [19]
Gerber et al.

[11] Patent Number: 5,291,392
[45] Date of Patent: Mar. 1, 1994

[54] METHOD AND APPARATUS FOR ENHANCING THE ACCURACY OF SCANNER SYSTEMS

[75] Inventors: Heinz J. Gerber, West Hartford; Ronald J. Straayer, South Windsor; Bruce L. Davidson, East Hartford, all of Conn.

[73] Assignee: Gerber Systems Corporation, South Windsor, Conn.

[21] Appl. No.: 838,500

[22] Filed: Feb. 19, 1992

[51] Int. Cl.5 .................................................. G06F 15/20
[52] U.S. Cl. ...................... 364/167.01; 346/160; 358/491; 359/212; 364/176
[58] Field of Search .................. 364/167.01, 525, 176, 364/550, 551.01; 358/474, 480, 481, 487, 488, 489, 490, 491, 493, 494, 495, 497; 250/235, 201.1, 202; 359/205, 212, 220; 346/108, 138, 160; 395/103; 354/4

[56] References Cited

U.S. PATENT DOCUMENTS

| | | | |
|---|---|---|---|
| 3,122,052 | 2/1964 | Buck | 359/205 |
| 3,555,254 | 1/1971 | Gerber | 364/474.35 |
| 3,651,256 | 3/1972 | Sherman et al. | 358/489 |
| 3,875,587 | 4/1975 | Pugsley | 358/80 |
| 3,984,747 | 10/1976 | Gerber et al. | 318/632 |
| 4,206,482 | 6/1980 | DeLavalette et al. | 358/491 |
| 4,260,997 | 4/1981 | Fukui | 346/108 |
| 4,293,864 | 10/1981 | Scott | 346/76 L |
| 4,404,596 | 9/1983 | Juergensen et al. | 358/293 |
| 4,468,707 | 8/1984 | Kuehnle et al. | 358/300 |
| 4,475,787 | 10/1984 | Starkweather | 359/211 |
| 4,525,749 | 6/1985 | Maeda et al. | 358/489 |
| 4,538,181 | 8/1985 | Taylor | 358/494 X |
| 4,568,984 | 2/1986 | Juergensen et al. | 358/484 |
| 4,589,746 | 5/1986 | Pavone | 354/4 |
| 4,595,957 | 6/1986 | Holthusen | 358/480 |
| 4,637,710 | 1/1987 | Fujii et al. | 355/72 |
| 4,638,370 | 1/1987 | Rosier et al. | 358/490 |
| 4,760,412 | 7/1988 | Murzyn | 354/4 |
| 4,801,810 | 1/1989 | Koso | 250/572 |
| 4,851,656 | 7/1989 | Straayer | 250/201 |
| 4,853,709 | 8/1989 | Stein et al. | 346/108 |
| 4,866,464 | 9/1989 | Straayer | 250/235 |
| 4,902,156 | 2/1990 | Deisler et al. | 403/24 |
| 5,115,328 | 5/1992 | Kadono | 358/480 X |
| 5,164,843 | 11/1992 | Swanberg | 358/480 X |

Primary Examiner—Joseph Ruggiero
Attorney, Agent, or Firm—McCormick, Paulding & Huber

[57] ABSTRACT

An apparatus for use in improving the accuracy of optical systems such as internal drum photoplotters includes a raster scanner responsive to control signals for advancing relative to a substrate an optical beam across a substrate surface in a first direction forming a scan line and for cooperatively advancing relative to the substrate the optical beam in a second direction substantially perpendicular to the first direction. A signal generator provides a clock signal configured to control the advancement of the optical beam in a first direction. There is a memory for storing error signals indicative of deviations of the curved surface from a preferred value of curvature. The apparatus is characterized by a controller for generating control signals in dependence on the error signals such that the phase of the clock signal is adjusted, thereby removing the curvature error for a segment of the scan line.

43 Claims, 5 Drawing Sheets

METHOD AND APPARATUS FOR ENHANCING THE ACCURACY OF SCANNER SYSTEMS

TECHNICAL FIELD

The present invention relates to scanners in general and, more particularly, to scanners in having error compensation for improved scan accuracy.

CROSS REFERENCE TO RELATED PATENTS AND PATENT APPLICATION

Some of the subject matter herein is disclosed and claimed in the following commonly owned U.S. patents and patent application which are incorporated herein by reference: U.S. Pat. No. 4,866,464—METHOD AND APPARATUS FOR GENERATING A SCAN TIMING SIGNAL WITH DIFFUSER AND DETECTOR ARRAY; U.S. Pat. No. 4,801,810—ELLIPTICAL REFLECTOR ILLUMINATION SYSTEM FOR INSPECTION OF PRINTED WIRING BOARDS; and U.S. Pat. No. 4,760,412—APPARATUS AND METHOD FOR EXPOSING LINES ON A PHOTOSENSITIVE SURFACE; and U.S. patent application Ser. No. 07/839,398, filed on Feb. 20, 1992 in the name of Alan W. Menard et al. and entitled PLOTTER DRUM AND METHODS OF FABRICATION AND ALIGNMENT THEREFOR.

BACKGROUND OF THE INVENTION

Raster scan photoplotters of both planar and internal drum design are known in the art. These devices are used in the fabrication of printed circuit boards. Planar photoplotters or imagers such as are disclosed and claimed in U.S. Pat. No. 4,851,656 and incorporated herein by reference have a planar surface for receiving a substrate. An optical exposure head is located on a movable gantry apparatus and is rastered above the substrate during exposure. Internal drum photoplotters have a cylindrical surface portion to receive the substrate. The exposure beam emanates from an optical exposure head and is scanned across the substrate. The optical exposure head is indexed along the longitudinal axis of the cylinder to complete the substrate exposure.

Internal drum raster photoplotters have inherent advantages over planar type scanners for several reasons, including simplicity of design and lower costs. However, both are subject to component tolerances which result in lower accuracy than would otherwise be possible. The drum surface is fabricated with inherent deviations from perfect cylindricity. Planar photoplotters or flatbed scanners are similarly afflicted by surface irregularities. These deviations result, in part, in scan lines (or segments thereof) on the substrate of varying lengths.

A compensation technique adaptable for use with a planar photoplotter or scanner is found in U.S. Pat. No. 3,555,254, incorporated herein by reference. Disclosed therein is a system for positioning a driven part in a numerically controlled positioning device. In the setting up of the system, the driven part is commanded to move to various positions spread over its field of movement and after it reaches each such position, its actual position is accurately measured to determine the error between the commanded position and the actual position. The values of the errors thus determined are stored in computer memory as a table of error values versus part position. Thereafter, as the driven part is moved to different positions relative to the reference member, the computer memory is interrogated and error values from the table are used to correct the commands transmitted to the motor drivers to take into account the repeatable error associated with the position of the driven part. The '254 system further includes an input device for providing position input commands, one or more motors for driving the driven part, and a computer for converting the input commands into corrected output commands.

In the prior art, internal drum raster photoplotters have been built with component defect compensation. For example, MDA of Vancouver, BC markets an internal laser raster drum photoplotter with compensation. First, the deviations from true cylindricity are determined as a function of position on the cylinder portion surface. The commanded raster pattern is thereafter shifted by incremental pixels at the photoplotting resolution (i.e. 0.25 mil). Pixels are dropped from the image and other pixels are duplicated as needed. These commanded shifts have the unfortunate effect, however, of distorting the image and introducing abrupt shifts of 0.25 mil in the photoplot. For example, if a shift were to occur exactly on a circuit trace, it would distort the width of this trace by the 0.25 mil error, which can be detrimental to the performance of the circuit.

It would be advantageous to have a system for providing compensation for inaccuracies in drum or flatbed raster photoplotters and scanners which would avoid abrupt shifts in the written substrate. The present invention is drawn toward such a system.

SUMMARY OF INVENTION

An object of the present invention is to provide a system for use with a photoplotter or scanner that compensates for inaccuracies in componentry.

Another object of the invention is to provide a system for use in a photoplotter or scanner of the forgoing type that determines errors in actual beam position on a substrate from a commanded position and adjusts the phase of a pixel scan signal to eliminate the error for a given scan line segment.

According to the present invention, an apparatus for providing compensation for inaccuracies in a scanning optical system that has a platen for receiving a substrate having a surface and a raster scanner responsive to control signals for advancing relative to the substrate an optical beam across the substrate surface in a first direction forming a scan line, the apparatus includes a signal generator for generating a clock signal configured to control the advancement of the optical beam in the first direction; a memory for storing error signals indicative of deviations of the substrate surface from preferred values thereof; and a controller for generating the control signals in dependence on the error signals such that the phase of the clock signal is adjusted, thereby removing the surface deviations for a segment of the scan line.

According to another aspect of the present invention, a method of providing compensation for inaccuracies in a scanning optical system that has a platen for receiving a substrate and a scanning means responsive to a clock signal for advancing relative to said substrate an optical beam across the substrate surface forming a scan line, the method includes the steps of generating command signal values for registration marks positioned about a substrate surface, exposing a calibration substrate to an optical beam so as to image said registration marks therein and generating signals indicative of the measured position of said registration marks in said substrate surface. The method also includes the steps of comparing the measured registration mark position signal values with the command position signal values to generate error signals corresponding to deviations of the measured registration mark positions from the command signal value positions and generating control signals to adjust the phase of said clock signal in dependence on the error signal magnitude, thereby removing the deviations from a scan line segment of the scan line.

DESCRIPTION OF THE PREFERRED EMBODIMENTS

Figure 1:
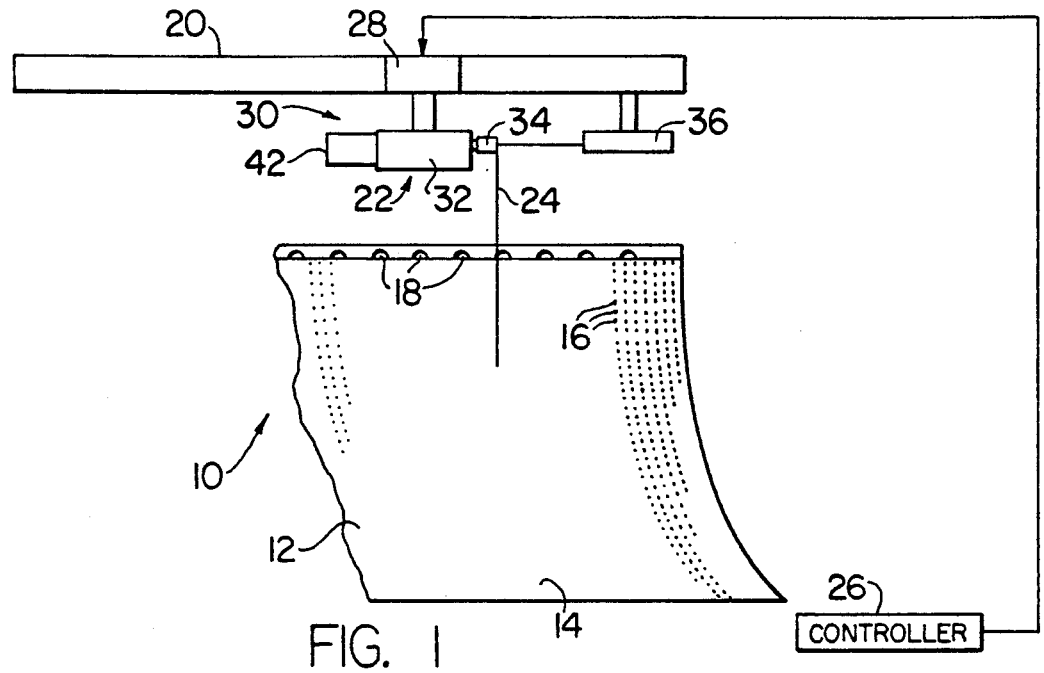
FIG. 1 is a simplified schematic illustration of a portion of an internal drum raster photoplotter providing accuracy compensation in accordance with the present invention.

Referring now to FIG. 1 there is shown in simplified schematic form a portion of an internal drum raster photoplotter 10 having an internal drum 12 with a surface 14 that comprises a portion of a cylinder. The internal drum is carefully fabricated and must maintain the cylindricity of the surface 14 with great accuracy regardless of variations in environmental parameters such as temperature. To that end the internal drum is a substantial structure preferably of cast aluminum with a series of reinforcing ribs (not shown) spaced along an outside perimeter.

Figure 2:
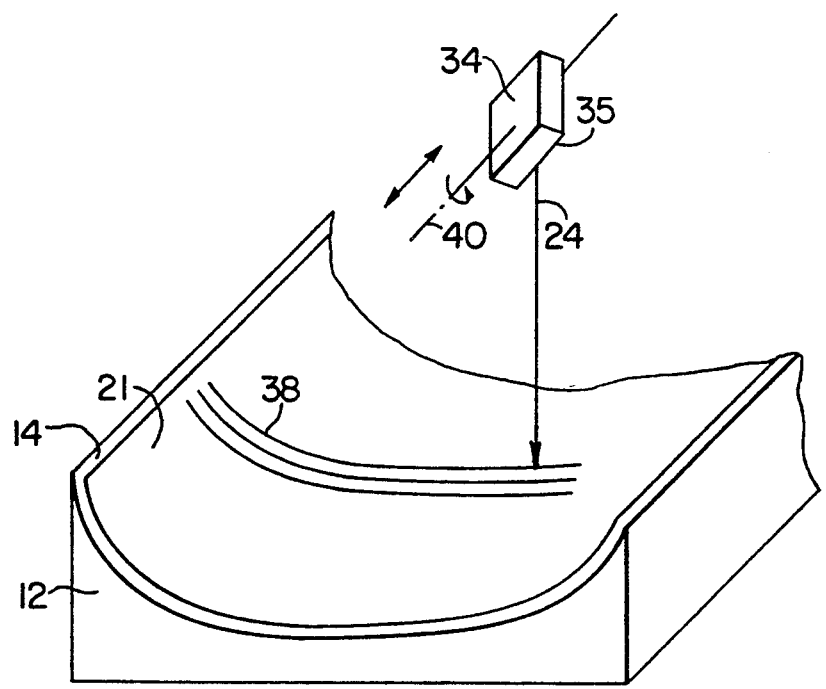
FIG. 2 is a simplified illustration showing the scanning of an optical beam across a portion of a substrate surface by the photoplotter of FIG. 1.

The surface 14 is adapted to receive a substrate and includes a plurality of holes 16 which communicate with a plurality of internal channels 18 through which a vacuum is generated by conventional apparatus not shown in the drawing. As shown in FIG. 2, the vacuum is used to hold a substrate 21 in place during the exposure process. Alternative methods can be equivalently used to hold the substrate in place, including electrostatic and mechanical retention techniques.

The photoplotter also includes a rail 20 that has a carriage mounted raster scanner 22 for scanning an optical beam 24 about the substrate surface in response to command signals received from controller 26 in a manner detailed hereinafter. The raster scanner includes a linear encoder 28 for generating signals indicative of the position of the raster scanner as it moves along the rail. Also included is a fast scan apparatus 30 preferably comprised of a motor 32 and mirror 34 for receiving the optical beam at a mirror surface 35 from an optical beam source, such as laser 36, and for exposing a series of scan lines 38 on the substrate by rotating the mirror about a spin axis 40, typically at 12,000 rpm. A rotary encoder 42 is included for generating signals indicative of the angular position of the mirror surface during a scan. The mirror surface is preferably fabricated to have an off axis parabolic curvature so that small deviations in the position of the optical beam from the longitudinal axis do not yield significant excursions of the optical beam from the preferred scan line. An alternative mirror is a 45° turning mirror.

Internal drum scanning optical systems such as scanners operating as data transmitters or imagers operating as data receivers face major challenges regarding their ability to achieve accuracy in their scanner function. Cylindrical scanning systems benefit greatly from their simplicity, but accuracy must be maintained. There are three axes whose alignment directly affects accuracy in a system as shown in either FIGS. 1 or 5. These are the axis of the cylinder, that of the rotating mirror and the axis of the optical beam. All three should be aligned relative to one another for maximum accuracy.

With a conventional plane mirror, misalignment of the optical beam and cylinder axes produces an out of squareness error. That is, the scan lines are not exactly perpendicular to the cylinder axis. Relative misalignment can be compensated by employing an off axis parabolic mirror. The off axis parabolic mirror has a fixed focus which spins around the drum and is unaffected by misalignment between the optical beam and mirror axes.

Fundamental to understanding the present invention is the distinction between accuracy and repeatability. By their fundamental nature, machines such as the mechanical components of the photoplotter of FIG. 1 have better repeatabilities than accuracies (or precisions). In other words, the present photoplotter tends to expose substrates with the same error repeatedly. The straightness of the machine ways, alignment, lead screw error, and feedback position error and most importantly, the deviation of the drum surface from true cylindricity, all contribute to the accuracy error, which tends to be repeatable. In contrast, repeatability error is, for example, random ball bearing signature or temperature variations. A machine's repeatability can be 2–10 times better than the machine tool's accuracy. The present invention improves accuracy by intentionally compensating for error. This compensation will then result in a machine whose accuracy is limited, in theory, only by its repeatability—a 2 to 10 times improvement.

The significant challenge in the fabrication of an optical system such as the present photoplotter is the achievement of accuracy. This is primarily a result of the requirement for extreme precision between the mirror spin axis and the cylindrical drum surface A radial error as small as 0.3 mil produces a 1.0 mil linear error in a plot. However, by compensation provided in accordance with the present invention, a +5.0 mil radial run out can yield an accuracy better than 1.0 mil.

Initially, a compensation plot is generated consisting of a regular grid of lines with a fixed spacing. It is desirable that this compensation plot be produced on mechanically stable media. However, techniques such as are disclosed in U.S. Pat. No. 4,867,566 and incorporated herein by reference can be used to further compensate for unstable media such as a printed circuit (PC) film substrate. The grid spacing is chosen to be less than the distance over which the machine error changes appreciably. The measured values are compared with values corresponding to a defect free drum surface, resulting in an error table in both X and Y directions for each grid intersection. This error table is then used, through an appropriate transformation, to create a compensation table which is loaded into memory associated with the controller. The compensation is an adjustment in the scan angle of the spinning mirror (either advance or retard) for each pixel. This is done by phase shifting a reference clock signal which controls pixel placement as detailed hereinbelow. Finally, a photoplot of this same grid is made with active correction. This plot is again measured and the correction is verified. This process can be repeated recursively.

The along scan (or fast scan) accuracy is solely dependent on the radius of scan. In the internal drum this is the scanner axis to the inside diameter/emulsion distance. It is well known, however, that small radial errors can cause substantial accuracy errors due to the large sweep angle. For a half cylinder:

$$E = \pi \Delta R$$

where E corresponds to the error in length accuracy and $\Delta R$ is the error in radius. As noted above, only a 0.3 mil radius error will produce a 1.0 mil accuracy error. By contrast, an internal drum raster photoplotter incorporating the present invention produces only a 0.06 mil shift.

However, this fast scan accuracy error can be effectively compensated electronically during imaging. As seen by way of reference to FIG. 4, a master clock signal 44 is generated which nominally provides a pulse for every pixel. This clock signal is generated by multiplying the scanner rotary encoder pulses (1000 per revolution) by a factor of about 200–300 in order to provide 2000 pulses per inch. However, in the case of a radius error it is necessary to adjust this master clock signal frequency, either up (longer radius) or down (shorter radius), by very small and precise amounts. For example, if the radius only changes by a sufficient amount to cause a 0.5 mil accuracy error in 22 inches, the clock signal will need to change by 0.0227% of the master clock frequency in order to compensate for it.

Figure 4:
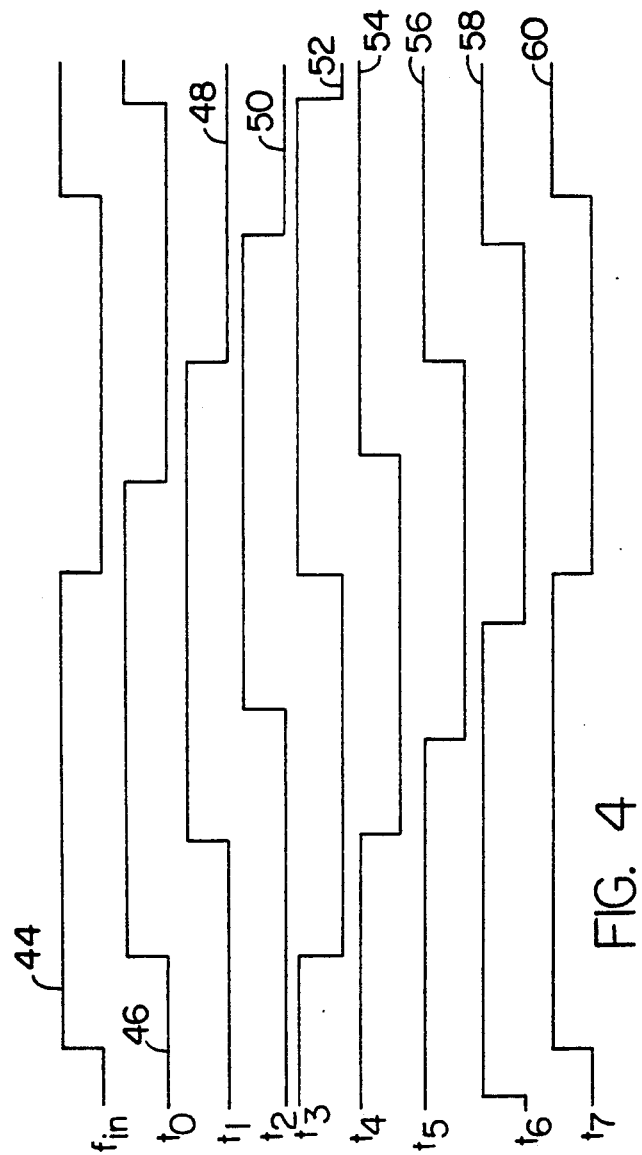
FIG. 4 is a diagrammatic illustration of phase shifted clock signals provided by the circuitry of FIG. 3.

Existing systems adjust pixel position through mapping whereby the pixel signal generation by a controller incorporates compensation in generating the exposure signals for each pixel. This mapping, however, results in abrupt pixel shifts in the image, which are objectionable. In contrast the present invention compensates for radial errors with subpixel resolution (⅛ pixel). As shown in FIG. 4, the master clock signal used in the fast scan is replicated into 8 additional clock signals 46–60 which are phase shifted with respect to each other by 45°. The process of compensating, then, is a process of shifting the phase in 45° increments either forward or backward. These small ⅛th pixel phase steps are too small to be visible, but by repetitively shifting the phase during the scan significant errors can be compensated. The example of a 1 pixel (0.5 mil) error described above would be compensated by 8 evenly spaced changes during the scan. The present invention encompasses nonlinear compensation, where compensation during a given scan line could change. This includes both positive and negative compensation within a scan line. Finally, it is possible to instrument the exposure process to automatically generate the compensation table.

Figure 3:
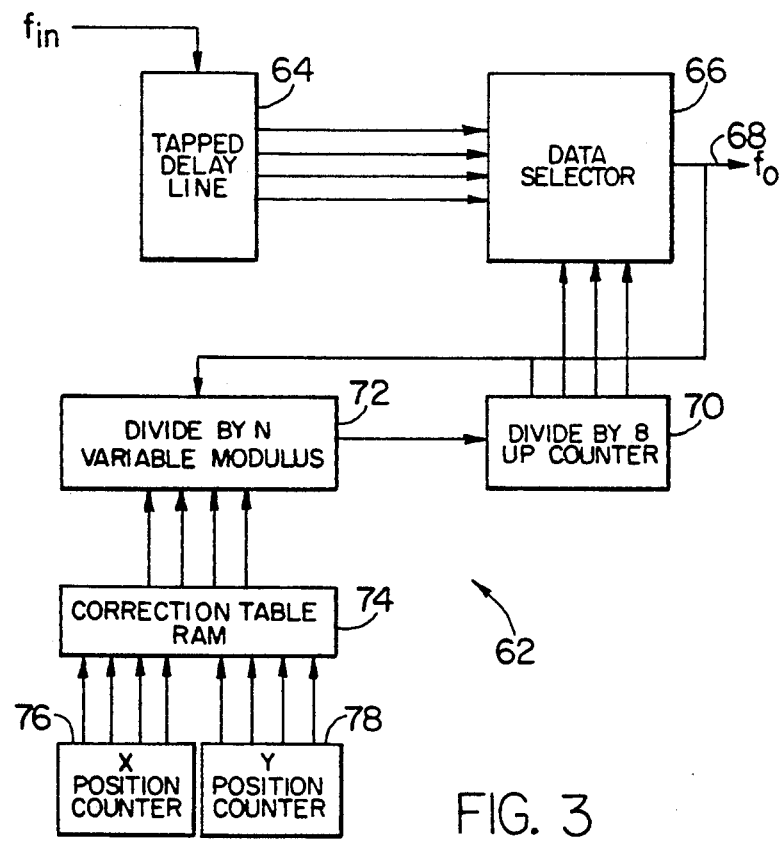
FIG. 3 is an illustration of a portion of compensation circuitry provided according to the present invention.

Referring now to FIG. 3, there is shown a portion of a compensation circuit 62 provided according to the present invention. The circuit utilizes a tapped delay line 64 selected such that each tap is ⅛ of the master clock signal period. An 8 to 1 data selector 66 allows each delay line tap to be selected as the output clock signal on line 68. This selector is connected to a divide by 8 counter 70 which, when clocked, will advance or retard the output clock signal by 45°. This counter is controlled by a divide by N counter 72, where N is determined by the present input. The frequency of the output clock signal is determined by the following equation:

$$f_{out} = \frac{8N * f_{in}}{8N + 1}$$

This equation is for retarding the phase, therefore resulting in a lower frequency than the input signal.

A correction, or mapping table RAM 74, is used to provide N correction signals to the variable modulus counter. The address signals input to the RAM are received from X and Y position counters 76, 78. This allows for a grid of correction areas, each about ½ inch square. A compensation value for each area is uniquely addressed as the image progresses. The correction RAM is dual ported so that it may be loaded from a central processor unit (CPU) associated with the controller. This RAM is nonvolatile so that only when compensation is changed will its contents have to be updated.

Figure 6:
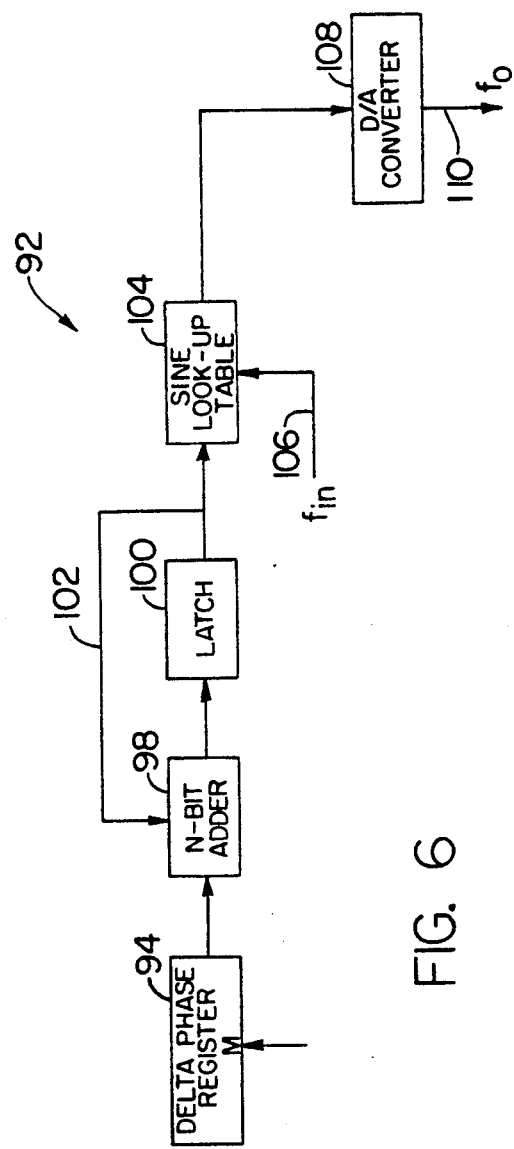
FIG. 6 is a simplified schematic illustration of circuitry used in an alternative accuracy compensation apparatus provided according to the present invention.
Figure 7:
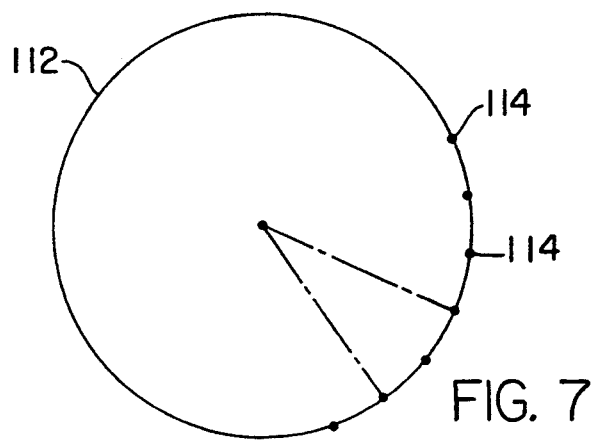
FIG. 7 is a diagrammatic illustration of clock signal phases provided by the circuitry shown in FIG. 6.

An alternative compensation circuit 92 is shown with respect to FIGS. 6 and 7. The circuit 92 offers another approach to clock signal syntheses and is characterized by very high resolution and the ability to increment phase changes by a digital signal input. The circuit 92 comprises a delta phase register 94 that receives on line 96 input signals corresponding to the phase difference between each clock signal. The output signal of the phase register is provided to an N bit adder 98 where N corresponds to the number of phase points. The output signal of latch 100 is provided as a latch indicator signal on line 102 to adder 98 and to a sine wave look up table 104. The master clock signal is presented on line 106. The resultant foreshortened phase signal is then synthesized with a high speed D/A converter and low pass filter 108 before presentation on line 110. Circuitry similar to that described with respect to FIG. 6 is marketed by the Qualcomm Co. as the model Q2334 frequency control circuit. The alternative compensation circuit is particularly suitable where the output sine wave must have very little harmonic distortion.

The basic concept behind the alternative circuit 92 is shown diagrammatically in FIG. 7. Curve 112 illustrates the total phase for one clock signal period. The circuit 92 divides the period into N phase points 114 where M phase points in sum comprise the desired phase increment between clock signals. The clock signal frequency is given by $$f_{out} = \frac{M * f_{in}}{2^N}$$

where M and N are as before and $F_{in}$ corresponds to the master clock signal frequency.

Data for mapping will be acquired for use in compensating a photoplotter generating a test grid as above with the compensation table set to zero value. This image is then measured on a validator system such as is found in the aforementioned U.S. Pat. No. 4,867,566. The controller generates a unique mapping table for that photoplotter. Once the mapping data is generated, it can be provided in one of several storage media (e.g. a 3.5 or 5.25 inch diskette). The controller can further provide the ability to shrink, or enlarge the image, and to compensate for temperature variations by altering the mapping data by applying a predetermined factor to all the mapping data. At powerup, or any time new data is generated, it can be redownloaded into the controller. In size, the mapping data for a standard internal drum is approximately 2000 characters, which requires about two seconds to download over a standard interconnection (RS232) at 9600 baud.

Figure 5:
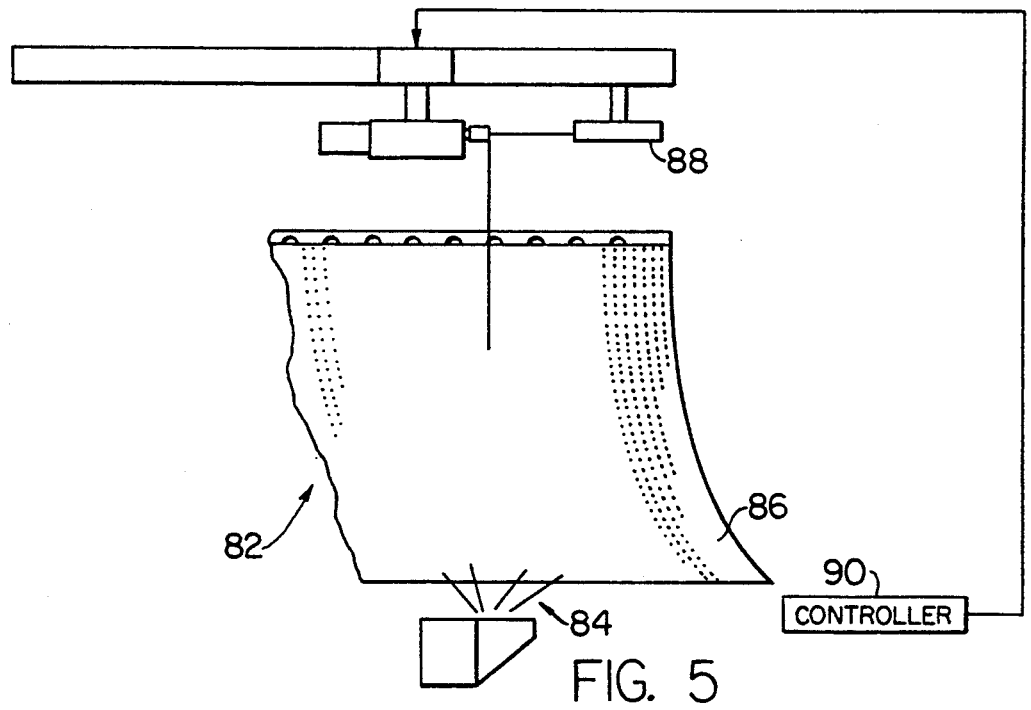
FIG. 5 is a simplified schematic illustration of a portion of an internal drum raster scanner providing accuracy compensation in accordance with the present invention.

The present invention also encompasses an optical system used as a scanner (reader) rather than an imager. As shown in FIG. 5, a scanner 82 is substantially the same as the photoplotter of FIG. 1 but it reads 2-D pixel data rather than records it. Such a scanner is used to transmit data (e.g., for facsimile), to capture it for manipulation (e.g., reverse engineering), or for inspection (e.g., AOI). The scanner 82 functions by illuminating the test sample with an unmodulated beam 84 of scanned light (e.g., CW) capturing the reflected or transmitted light after it leaves copy 86. These transmitted or reflected optical signals are received by detector 88 and then digitized at 1 or more bits per pixel by controller 90. Planar substrates may also be inspected in accordance with a variety of the above referenced automatic optical inspection techniques (AOI) such as are disclosed in U.S. Pat. Nos. 4,500,202; 4,518,810; 4,668,982 and 4,776,022 and incorporated herein by reference.

The method used to increase the accuracy of the scanner is similar to that used for the recorder. In the scanner's case however, a calibration grid plot is placed in the internal drum and then scanned. This plot is either highly accurate or has been calibrated and its errors tabulated. The scanned data is then compared with the known error data and a new error table is generated which is specific to this scanner. This error table is then entered into the scanner controller as compensation data. With the compensation system active, the calibration grid plot is rescanned. The resulting error data are compared with the tabulated error data for the calibration grid plot for verification. The above process may be repeated recursively.

Figure 8:
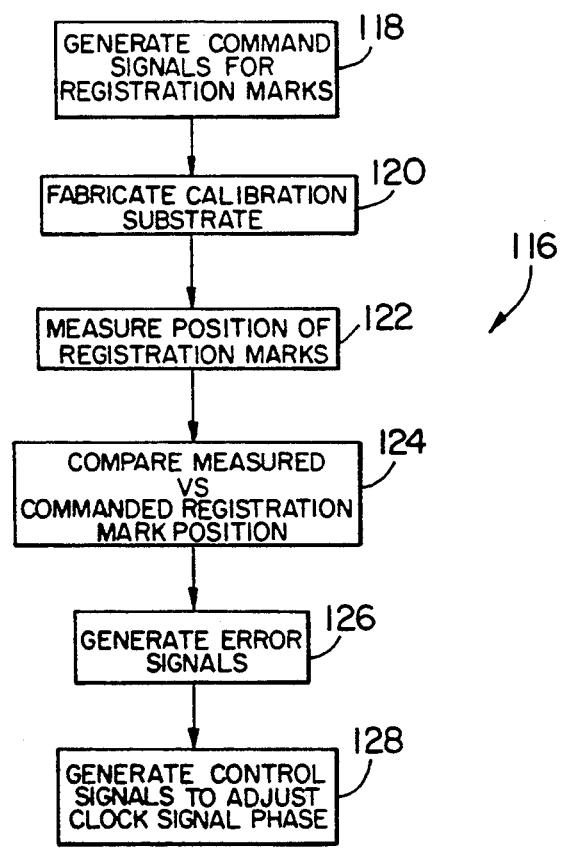
FIG. 8 is a diagrammatic illustration of an error compensation process as provided by the present invention.

FIG. 8 is a diagrammatic illustration of an algorithm 116 executed by a compensation apparatus provided according to the present invention. At block 118, command signals are generated for use in imaging registration marks on a substrate. These registration marks or an inspection grid need not be regularly located about the substrate surface, but must be at a known location thereon. A calibration substrate is prepared by exposing the substrate to an optical beam to image the registration marks in the substrate (block 120).

The position of the registration marks on the substrate surface can be determined at block 122 using any number of known inspection techniques, such as disclosed in U.S. Pat. No. 4,589,746 incorporated herein by reference. At block 124, the measured registration mark positions are compared with the commanded registration mark positions to generate a table of error signals (block 126) that correspond to the deviations of the measured registration marks' positions from those of the commanded registration marks' positions on the substrate.

With this error table, the compensation apparatus generates a database of error signal values which are combined with the control signals generated by the scanner when advancing the beam relative to the substrate along a scan line. As noted above, the data signals are either imaged on the substrate in an imager or read from the substrate in a scanner or digitizer at a nominal frequency established by a master clock signal. The present compensation apparatus generates, at block 128, control signals to be presented to the scanner clock signal generator to adjust the phase of the clock signal as compared to the master clock signal. This adjustment eliminates the deviations from the commanded and the actual positions of the scan line segments in subsequent scans of other substrates.

Those skilled in the art will note that the present invention can be used in eliminating inaccuracies in scanning optical systems regardless of the platen surface configuration (flat or curved) or whether the scanner is an imager or a digitizer. Moreover, it can be used to calibrate scanning systems regardless of their source of manufacture.

Also, the present invention can be used to measure the existing artwork from other scanning systems by generating an error table based on a comparison between the command signals used, as an example, to generate a plot of interest as compared to the measured location of its pixels. Consequently, the compensation apparatus can be used to alter the existing error table for a given system so as to "distort" the pixel generation process to yield a plot that matches existing artwork.

The present compensation system can be retrofitted to an existing system to compensate for a particular system's inaccuracies. A calibration substrate is fabricated as indicated above, possibly at a location distant from the system providing the accuracy compensation data. The error correction table can be generated and sent to the location of the scanning system by a variety of methods, including via modem to the system's computer. Further, note that the calibration procedure set forth above can be used to repeatedly compensate for machine wear and slow drift due to environmental factors, thereby enabling an extension of the scanning system product life beyond the point at which it would have normally been replaced.

As set forth above, the present invention contemplates correction of errors in scanning systems, such as an internal drum raster photoplotter. A special advantage of the present invention is that the accuracy compensation process takes place when the product is in its final form; that is when the substrate is flat. It is known that substrates in many applications are a laminate composite of, for example, an emulsion—plastic—emulsion configuration. Bending the substrate, as occurs when it is placed on a curved platen, introduces a random variable in error analysis since the different layers usually have different moduli of elasticity. When the substrate is curved, it is stressed and the states of its layers vary from compression to tension depending on random parameters so that an error measurement taken in the curved state will generally not be repeatable. The present invention is immune to differential stress between the different layers since measurement occurs with the substrate in a flat state.

Similarly, although the invention has been shown and described with respect to a preferred embodiment thereof, it would be understood by those skilled in the art that other various changes omissions and additions thereto may be made without departing from the spirit and scope of the present invention.

We claim:

1. An apparatus for providing compensation for inaccuracies in a scanning optical system that has a platen for receiving a substrate having a surface and a raster scanning means responsive to clock signals for advancing relative to said substrate an optical beam across said substrate surface in a first direction forming a scan line, said apparatus comprising:
   a signal generator means for generating a plurality of clock signals, each of said clock signals being configured to control the advancement of said optical beam in said first direction, and including means for shifting the phase of said clock signals relative to each other;
   a memory means for storing error signals, each error signal being indicative of deviations in a respective area of said substrate surface from preferred values thereof; and
   a controller for transmitting control signals in dependence on said error signals to said signal generator means, said signal generator means being responsive to each of said control signals to transmit one of said plurality of phase-shifted clock signals to said raster scanning means, said transmitted clock signal being selected based on a respective error signal to compensate for deviations in the respective area of said substrate surface and substantially avoid corresponding deviations in the scan line.

2. The apparatus of claim 1 wherein said platen comprises an internal drum of a raster photoplotter.

3. The apparatus of claim 2 further comprising a means for generating said optical beam.

4. The apparatus of claim 2 further comprising a means for cooperatively advancing relative to said substrate said optical beam in a second direction substantially perpendicular to said first direction and an encoder means for generating signals indicative of a current position of said raster scanning means along a drum longitudinal axis.

5. The apparatus of claim 2 further comprising an encoder means for generating signals indicative of a current position of said optical beam along said scan line.

6. The apparatus of claim 2 wherein said raster scanning means comprises a mirror configured to move substantially along an internal drum longitudinal axis for providing said optical beam to said substrate within an included angle, thereby exposing a scan line.

7. The apparatus of claim 6 wherein said mirror is a 45° turning mirror.

8. The apparatus of claim 6 wherein said mirror has a curved reflective surface that comprises a portion of an off axis parabola.

9. The apparatus of claim 1 wherein said clock signals generated by said signal generator means are substantially evenly spaced within a master clock signal period.

10. The apparatus of claim 9 wherein said signal generator means provides 8 clock signals spaced approximately 45° apart per master clock signal period.

11. The apparatus of claim 2 wherein said scan line is comprised of a plurality of pixels and wherein each clock signal transmitted by said signal generator means corresponds to one of said pixels.

12. The apparatus of claim 1 wherein said platen surface is defined by a planar surface of a raster photoplotter.

13. The apparatus of claim 1 wherein said scanning optical system further comprises a means for receiving said optical beam from a scan line segment and for generating therefrom electrical signal equivalents indicative of intensity variations of said optical beam.

14. The apparatus of claim 13 further comprising a means for illuminating said scan line segment, thereby generating said optical beam.

15. The apparatus of claim 1 further comprising a means for removably affixing said substrate to said platen so as to have said substrate substantially conform thereto.

16. An apparatus as defined in claim 1, wherein said signal generator means comprises a tapped delay line including an input for receiving a clock signal, and an output for transmitting a plurality of clock signals phase shifted relative to each other.

17. An apparatus as defined in claim 16, wherein said signal generator means further comprises a data selector coupled to said tapped delay line and responsive to said control signals to transmit one of said plurality of phase-shifted clock signals to said raster scanning means.

18. An optical photoplotter comprising:
   an optical source for generating an exposure beam;
   a platen surface for receiving a substrate;
   a raster scanning means for advancing relative to said substrate an optical beam across a substrate surface in a first direction forming a scan line and for cooperatively advancing relative to said substrate surface said optical beam in a second direction substantially perpendicular to said first direction;
   a signal generator means for generating a plurality of clock signals each of which is phase shifted relative to another such that said clock signals are spaced within a master clock signal period, at least one of said plurality of clock signals being transmitted to said raster scanning means to control the advancement of said optical beam in said first direction;
   a memory means for storing error signals indicative of deviations of said substrate surface from preferred values thereof; and
   a controller for transmitting control signals in dependence on said error signals to said signal generator means, said signal generator means being responsive to each of said control signals to transmit one of said plurality of phase-shifted clock signals to said raster scanning means, said transmitted clock signal being selected based on a respective error signal to compensate for corresponding deviations in said substrate surface and substantially avoid deviations in the scan line.

19. The optical photoplotter of claim 18 further comprising an encoder means for generating signals indicative of a current position of said raster scanning means along a longitudinal axis.

20. The optical photoplotter of claim 18 further comprising an encoder means for generating signals indicative of a current position of said optical beam along said scan line.

21. The optical photoplotter of claim 18 wherein said platen surface is curved and said raster scanning means comprises a mirror configured to move substantially along a longitudinal axis for providing said optical beam to said substrate within an included angle, thereby exposing a scan line.

22. The optical photoplotter of claim 21 wherein said mirror is a 45° turning mirror.

23. The optical photoplotter of claim 21 wherein said mirror has a curved reflective surface that comprises a portion of an off axis parabola.

24. The optical photoplotter of claim 18 wherein said clock signals generated by said signal generator means are substantially evenly spaced within a master clock signal period.

25. The optical photoplotter of claim 24 wherein said signal generator means provides 8 clock signals spaced approximately 45° apart per master clock signal period.

26. The optical photoplotter of claim 18 wherein said scan line is comprised of a plurality of pixels and wherein each of said clock signals transmitted by said signal generator means provides a clock pulse for each of said pixels.

27. The optical photoplotter of claim 18 wherein said photoplotter further comprises a means for removably affixing said substrate to said platen so as to have said substrate substantially conform thereto.

28. In a photoplotter having a platen defining a surface for receiving a substrate; a raster scanning means for advancing relative to said substrate an optical beam across a substrate surface in a first direction forming a scan line; a signal generator means for generating a clock signal configured to control the advancement of said optical beam in said first direction; a method of compensation for errors in said scan line comprising the steps of:
  generating signals indicative of measured values of platen surface geometry;
  comparing said measured platen surface geometry signal values with signal values corresponding to preferred values of platen surface geometry and generating error value signals, each error value signal being indicative of a respective deviation of said measured platen surface geometry from said preferred signal values of platen surface geometry; and
  transmitting control signals to said signal generator means, each control signal corresponding to a respective error value signal to adjust the phase of said clock signal in dependence on the respective error signal magnitude, thereby compensating for deviations in a respective area of said platen surface and substantially avoiding errors in a segment of said scan line.

29. The method of claim 28 wherein said platen is curved and wherein said photoplotter further comprises a means for cooperatively advancing relative to said substrate said optical beam in a second direction substantially perpendicular to said first direction.

30. The method of claim 28 wherein said platen is planar and wherein said photoplotter further comprises a means for cooperatively advancing relative to said substrate said optical beam in a second direction substantially perpendicular to said first direction.

31. The method of claim 28 wherein said photoplotter further comprises a means for removably affixing said substrate to said platen so as to have said substrate substantially conform thereto.

32. A method as defined in claim 28, further comprising the steps of generating a plurality of clock signals phase shifted relative to each other, and transmitting each control signal based on the value of a respective error signal, to in turn select one of the phase-shifted clock signals for transmission to said raster scanning means to compensate for the deviations corresponding to the respective error signal, and substantially avoid corresponding deviations in the scan line.

33. A method as defined in claim 32, comprising the step of generating a plurality of clock signals phase shifted approximately 45° relative to each other.

34. A method as defined in claim 28, further comprising the steps of generating signals indicative of remeasured values of platen surface geometry; comparing said remeasured signals with said preferred signal values; and generating new error value signals, each new error value signal being indicative of deviations of said remeasured values of platen surface geometry from said preferred signal values of platen surface geometry; and transmitting new control signals to said signal generator means, each new control signal being based on a respective new error value signal.

35. A method of providing compensation for inaccuracies in a scanning optical system that has a platen for receiving a substrate and a scanning means responsive to a clock signal for advancing relative to said substrate an optical beam across said substrate surface forming a scan line, said method comprising the steps of:
  generating command signal values for registration marks positioned about a substrate surface;
  exposing a calibration substrate to an optical beam so as to image said registration marks therein;
  generating signals indicative of the measured positions of said registration marks in said substrate surface;
  comparing said measured registration mark position signal values with said command position signal values to generate error signals corresponding to deviations of said measured registration mark positions from said command signal value positions; and
  generating control signals corresponding to respective error signals, each control signal being selected to adjust the phase of said clock signal in dependence on the magnitude of said respective error signal to compensate for the deviations corresponding to the respective error signal, thereby removing said deviations from a segment of said scan line.

36. The method of claim 35 wherein said platen is curved and wherein said method further comprises the step of placing said substrate on a flat surface prior to measuring said registration marks' positions.

37. The method of claim 35 wherein said method comprises the steps of generating a plurality of clock signals substantially evenly separated in phase from a master clock signal, and each control signal selects one of said clock signal plurality for transmission to said scanning means based on the magnitude of said respective error signal, to remove said deviations from a scan line segment.

38. The method of claim 35 wherein said method further comprises the steps of illuminating said substrate with an optical beam.

39. A method of providing compensation for inaccuracies in a scanning optical system that has a platen for receiving a substrate and a scanning means responsive to a clock signal for advancing relative to said substrate an optical beam across said substrate surface forming a scan line, said method comprising the steps of:
  generating command signal values for registration marks positioned about a substrate surface;
  exposing a calibration substrate to an optical beam so as to image said registration marks therein;

generating signals indicative of the measured position of said registration marks in said substrate surface;

comparing said measured registration mark position signal values with said command position signal values to generate error signals corresponding to deviations of said measured registration mark positions from said command signal value positions;

generating control signals to adjust the phase of said clock signal in dependence on said error signal magnitude, and remove said deviations from a segment of said scan line;

storing said control signals;

generating signals indicative of a remeasured position of said registration marks in said substrate surface;

comparing said remeasured registration mark position signal values with said command position signal values to generates new error signals corresponding to deviations of said remeasured registration mark positions from said command signal value positions; and generating new control signals to adjust the phase of said clock signal in dependence on said new error signal magnitude.

40. An apparatus for use with an optical scanning system that has a curved platen for receiving a substrate having a surface and a raster scanning means responsive to control signals for advancing relative to said substrate an optical beam across said substrate surface in a first direction forming a scan line, said apparatus comprising:

a mirror having a curved reflective surface defined by at least a portion of an off axis parabola;

a positioning means for generating signals indicative of the angular position of said reflective surface for locating said mirror to optically communicate with said substrate surface; and a means for rotating said curved reflective surface about an axis within an included angle in response to said control signals.

41. The apparatus of claim 40 further comprising a means for move said raster scanning means relative to said substrate in a second direction substantially perpendicular to said first direction.

42. The apparatus of claim 40 further comprising an optical source of generating said optical beam.

43. The apparatus of claim 40 further comprising a means for receiving said optical beam from said scan line segment and for generating therefrom electrical signal equivalents indicative of intensity variations of said optical beam.

* * * * *